US007308625B1

(12) United States Patent
Wingen et al.

(10) Patent No.: US 7,308,625 B1
(45) Date of Patent: Dec. 11, 2007

(54) DELAY-FAULT TESTING METHOD, RELATED SYSTEM AND CIRCUIT

(75) Inventors: Neal Wingen, Iverness, IL (US); Gregory Ehmann, Sleepy Hollow, IL (US)

(73) Assignee: NXP B.V., Eindhoven (NL)

( * ) Notice: Subject to any disclaimer, the term of this patent is extended or adjusted under 35 U.S.C. 154(b) by 217 days.

(21) Appl. No.: 10/559,170

(22) PCT Filed: May 28, 2004

(86) PCT No.: PCT/IB2004/001750
§ 371 (c)(1),
(2), (4) Date: Dec. 1, 2005

(87) PCT Pub. No.: WO2004/106958
PCT Pub. Date: Dec. 9, 2004

Related U.S. Application Data

(60) Provisional application No. 60/475,239, filed on Jun. 3, 2003.

(51) Int. Cl.
*G01R 31/28* (2006.01)
(52) U.S. Cl. .................... 714/724; 324/76.35
(58) Field of Classification Search ............... 714/726, 714/55, 731, 744, 724; 324/76.35
See application file for complete search history.

(56) References Cited

U.S. PATENT DOCUMENTS

| | | | | |
|---|---|---|---|---|
| 5,365,528 A | * | 11/1994 | Agrawal et al. ............ 714/736 |
| 5,761,215 A | * | 6/1998 | McCarthy et al. .......... 714/726 |
| 5,889,788 A | * | 3/1999 | Pressly et al. ............... 714/726 |
| 6,065,145 A | * | 5/2000 | Bencivenga ................. 714/724 |
| 6,148,425 A | * | 11/2000 | Bhawmik et al. ........... 714/726 |
| 6,400,129 B1 | * | 6/2002 | Yamaguchi et al. ...... 324/76.82 |
| 6,437,553 B1 | * | 8/2002 | Maloney et al. ......... 324/76.35 |
| 2003/0020451 A1 | | 1/2003 | Ozaki | |
| 2003/0021464 A1 | | 1/2003 | Takeoka et al. | |

OTHER PUBLICATIONS

Bailey et al: "Test Methodology for Motorola's High Performance E500 Core Based on PowerPC Instruction Set Architecture" Proceedings International Test Conf. 2002. ITC 2002. Baltimore, MD, Oct. 7-10, 2002, International Test Conf., New York, NY: IEEE, US; pp. 574-583.

* cited by examiner

*Primary Examiner*—David Ton
(74) *Attorney, Agent, or Firm*—Peter Zawilski

(57) ABSTRACT

A testing approach involves selective application of clock signals to target circuitry. In an example embodiment (300), a target circuit (332) having logic circuitry that processes data in response to an operational clock signal (308) having at least one clock period, is analyzed for delay faults. Test signals are applied to the logic circuitry while the logic circuitry is clocked with a high-speed test clock (309) having several clock-state transitions that occur during at least one clock period of the operational clock (308). An output from the logic circuitry is analyzed for its state (e.g., as affected by delay in the circuitry). Delay faults are detected as a difference in state of the output of the logic circuitry. With this approach, circuits are tested using conventional testers (340) that operate at normal (e.g., slow) speeds while selectively clocking selected portions of the circuit at higher speeds for detecting speed-related faults therein.

20 Claims, 3 Drawing Sheets

DELAY-FAULT TESTING METHOD, RELATED SYSTEM AND CIRCUIT

CROSS REFERENCE TO RELATED APPLICATION

This application claims the benefit of U.S. provisional application Ser. No. 60/475,239 filed 3 Jun. 2003, which is incorporated herein whole by reference.

The present invention relates generally to testing electrical circuits and, more particularly, to circuit testing methods and arrangements involving test signals including timing signals.

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, manufacturing and testing processes become more difficult.

A wide variety of techniques have been used in electronic circuit devices to ensure that, once they are manufactured, they operate fully in compliance with their intended design and implementation specifications. However, as the operating speed of circuits is increased to meet demands for higher-functioning devices, defects and other failures occur due to the high operating speeds. In this regard, many circuits exhibit suspect defects that occur at a higher rate as the operating speed of the circuit is increased.

One such defect that has surfaced with high-speed operation of circuit sites exhibiting speed-sensitive defects is a resistive electrical connection. Resistive interconnections have been a major circuit manufacturing problem in terms of yield, performance, and reliability, and this problem is expected to increase in importance as the number of interconnection levels and operating frequencies increase. Such resistive connections tend to react slower than other circuit portions, resulting in a delay in the response of the circuit site to input signals (e.g., a delay fault). Such a delay, for example, can result in incorrect data being provided, switching delays or other problems. For these delay faults to be analyzed, however, the circuit has to be operated (clocked) at relatively high frequencies. While the ability to detect these defective interconnections can be extremely useful for diagnosing IC failures and implementing corrective action, such detection often requires high frequency operation to produce a functional failure.

Traditionally, detecting delay-type faults has been attempted by operating the circuit with test vectors in a manner that causes a failure to occur. However, such electrical testing has typically required that the clock used during the test vector application (test clock, or TCK) be increased to a speed at which delay faults tend to occur. This approach has typically required, for example, a tester with a high-speed test clock or other approach, such as a multiplier. These approaches, however, have been limited in that traditional testers do not operate at high speed, testers employing high-speed test clocks are typically expensive and require that all tests be performed at high-speed, and multipliers are limited in frequency application to multiples of the test clock.

These and other difficulties present challenges to the design and testing for a variety of applications.

Various aspects of the present invention involve testing approaches for a variety of circuits, such as those including memory circuits and others. The present invention is exemplified in a number of implementations and applications, some of which are summarized below.

According to an example embodiment of the present invention, a circuit is tested using an approach involving a relatively low-speed operational clock and a high-speed test clock that is selectively implemented for clocking target circuitry. The high-speed test clock is adapted to use inputs from a test signal generator and the operational clock to operate, or clock, logic circuitry while test signal inputs are provided to the target circuitry. An output from the target circuitry is detected and a delay in the output (e.g., relative to an expected output) is detected as a delay fault. With this approach, a conventional tester can be used to analyze the circuit while also clocking the circuit with a high-speed clock that is controllable separately from the operational clock of the conventional tester.

In a more particular example embodiment of the present invention, a circuit tester having control signals is used to exercise a target circuit in a test mode using an operational clock while concurrently using a test-clock signal to exercise logic circuitry in the target circuit. The operational clock signal has at least one clock cycle and the test-clock signal has at least four clock-state transitions that occur within the at least one clock cycle. In one implementation, the operational clock has a frequency, and the test-clock signal has a frequency that is at least twice as fast as the operational clock frequency. In response to the test-clock signal, the logic circuit generates an output that is received and processed by the circuit tester to detect a delay fault in the target circuit.

In still another example embodiment, a circuit device includes an on-board high-speed clock circuit that is programmable and operable in connection with an external circuit tester. The high-speed clock circuit is adapted to selectively use a high-speed clock signal from a high speed clock and test signals from the external circuit tester to selectively apply the high-speed clock signal to logic circuitry in the circuit device during a capture mode. During a non-capture mode, the high-speed clock circuit passes an operational speed clock signal from the external circuit tester. In one instance, the high-speed clock circuit executes a delay sequence at the initiation of the capture mode and clocks the logic circuitry with the high-speed clock signal during a middle portion of the capture cycle after the delay sequence is initiated. The high-speed clock circuit then disables the application of the high-speed clock signal prior to the end of the capture cycle.

The above summary of the present invention is not intended to describe each embodiment or every implementation of the present invention. The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 1:
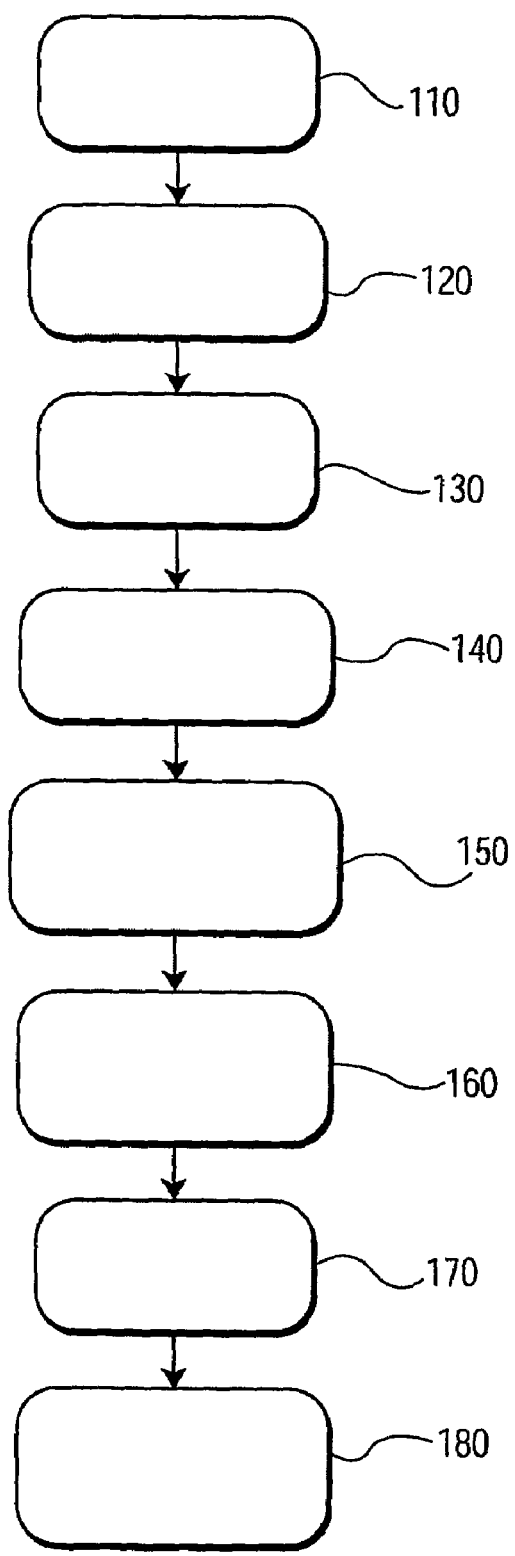
FIG. 1 is a flow diagram for testing an electronic circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving and/or benefiting from testing, and in particular to testing involving timing approaches and circuits. While the present invention is not necessarily limited to such applications, an appreciation of various aspects of the invention is best gained through a discussion of examples in such an environment.

According to an example embodiment of the present invention, an electronic circuit is tested using an approach involving a high-speed clock circuit to selectively apply a high-speed clock signal to the electronic circuit during a test mode. The high-speed clock circuit may be implemented, for example, in connection with a conventional-type circuit tester having an operational clock with a speed that is relatively slow. In one implementation, the high-speed clock circuit is part of the electronic circuit being tested. In another implementation, the high-speed clock circuit is part of a circuit tester that also has a slower operational clock as discussed above. In still another implementation, the high-speed clock circuit is separate from the electronic circuit being tested and from a circuit tester used for applying test signals to the electronic circuit. In each of these instances, an output from the electronic circuit is detected and a timing-related change therein is used to detect the presence of a timing-type condition, such as a resistive circuit or a delay fault. With this approach, a circuit tester may be operated in a conventional (i.e., low speed) mode for operating the electronic circuit, with the detection of the output generated in response to the test-clock signal being effected without necessarily modifying the operation of the circuit tester.

In a more particular implementation, the high-speed clock circuit is adapted to use inputs from a circuit tester for selectively applying the high-speed clock signal during a middle portion of a capture mode of the circuit tester. Several clock-state transitions are generated during a single period of the operational clock signal by the high-speed clock circuit. A start input (e.g., a scan enable input) is used to initiate the capture mode as well as a sequence of timing events that selectively delays the application of the high-speed clock signal for one or more of the clock-state transitions thereof after the capture mode has been initiated. The sequence of timing events are executed using logic circuitry that also disables the high-speed clock signal prior to the termination of the capture mode.

FIG. 1 is a flow diagram showing an approach for delay fault testing of an electronic circuit, according to an example embodiment of the present invention. At block 110, a circuit tester is enabled and generates a relatively low-speed clock signal (e.g., a clock signal for a JTAG (Joint Test Access Group) tester using automatic test pattern generation (ATPG)). At block 120, a rapid clock signal is generated (e.g., using clock generation circuitry on the electronic circuit). A test scan is enabled at block 130 for testing the electronic circuit using the relatively low-speed clock signal. A delay sequence for delaying the implementation of the rapid clock with the electronic circuit is begun at block 140 (e.g., in a capture mode) and held for a selected amount of time. After the delay, the rapid clock is applied for clocking the target circuit at block 150 for a short time period (e.g., a few clock-state transitions) for detecting a delay fault, and the rapid clock is disabled at block 160. An output from the target circuit as operated by the rapid clock is received at block 170, which may, for example, be detected at least in part during the disabling of the rapid clock signal at block 160. The output is evaluated at block 180 for a delay fault. If there is no additional delay (i.e., during block 150), the signal is detected as not being indicative of a defect. However, if there is additional delay in the output signal (during block 150), the delay is detected as being indicative of a defective circuit, such as one having a resistive connection. After the rapid clock has been implemented for detecting a delay fault, the clock application can be repeated, for example, for shifting in a new test vector and restarting the sequence beginning at block 110.

The approach discussed above can be implemented using a variety of approaches for detecting a delayed signal. One such approach involves using a phase-locked-loop (PLL) to generate the capture clock for an output signal, such as the clock signal generated at block 110 in FIG. 1. The PLL is implemented, for example, using circuitry on the target circuit to generate a system frequency. For instance, when an output of a target circuit being analyzed is known relative to an input clock signal (e.g., as "locked" to a clock-state transition of the input clock signal), an unexpected change in the output can be used to detect a delayed response.

Figure 2A:
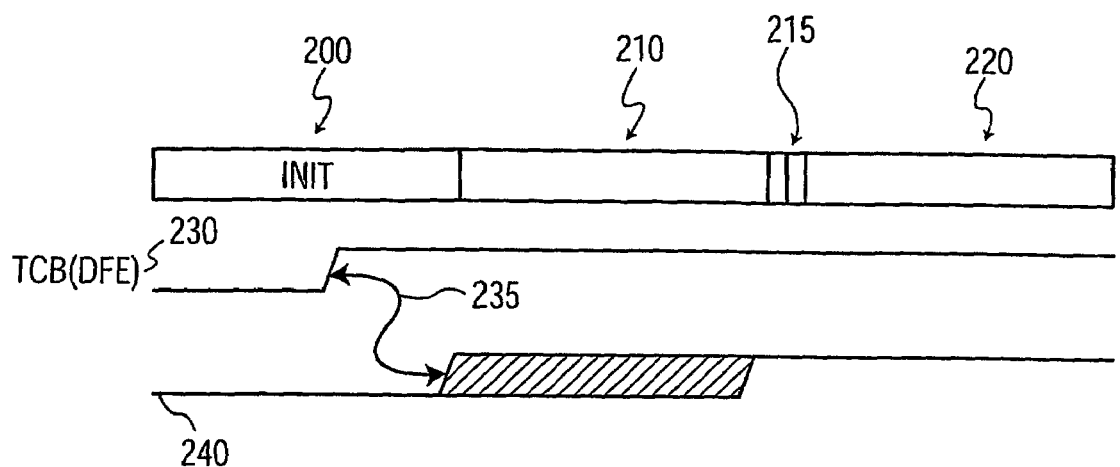
FIG. 2A shows an approach for circuit testing involving signal synchronization with a phase-locked loop (PLL), according to another example embodiment of the present invention.

FIG. 2A exemplifies another approach to locking that is implemented in connection with one example embodiment of the present invention, with a rapid clock for operating a target circuit being generated on the target circuit (e.g., an on-chip clock). The approach shown in FIG. 2A is directed to a three-mode delay fault test process and may, for example, be implemented in connection with the approach shown in FIG. 1 discussed above and also with the signals and approach discussed further below in connection with FIG. 2B. Different tester states for a circuit tester include an initialization state 200, a shift state 210 (in which a first shift vector is applied), a capture state 215 (during which a high speed clock is applied) and an output state 220 (during which the first shift vector is shifted out and a second shift vector is applied). Two signals 230 and 240 as shown are respectively directed to a test control block (TCB) circuit signal and a phase-locked loop (PLL) signal. With the TCB signal 230, the TCB is implemented for analyzing a target circuit (e.g., a circuit board) for delay fault enable (DFE) testing. The PLL signal 240 begins to lock, or synchronize, with the input clock after the rising state-transition (low-to-high) of the TCB signal 230. The line 235 shows a delay between the start and end of locking for the PLL, which is locked before the capture state 215. The output clock from the PLL is then used in the capture state 215 of an output from a circuit being tested, such that the output signal captured is analyzed to a reference (the locked phase) and a change in timing thereof is readily detected.

Figure 2B:
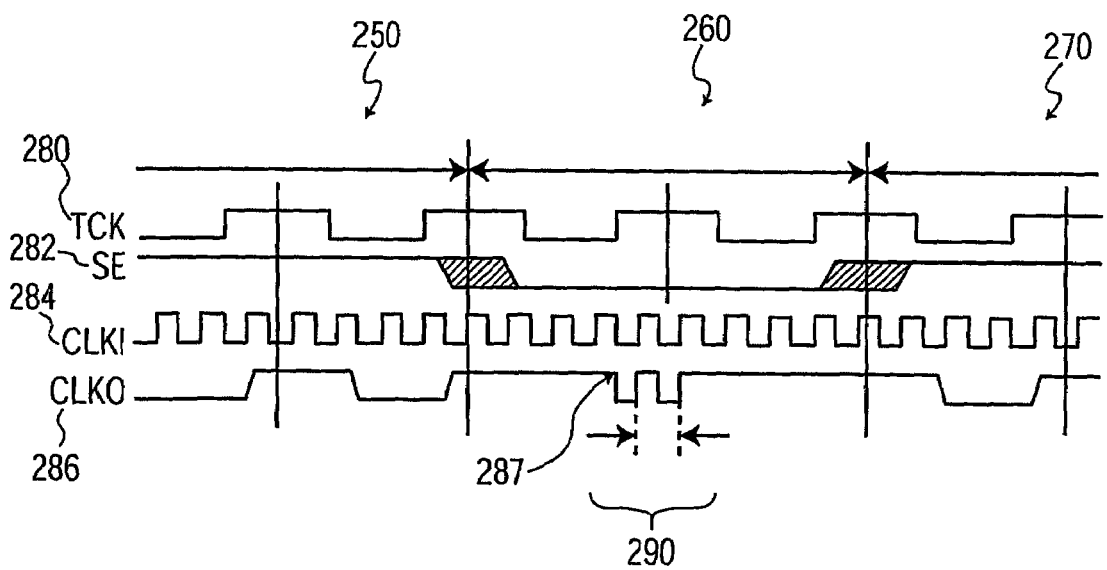
FIG. 2B shows an approach for circuit testing involving a delay-fault testing, according to another example embodiment of the present invention.

FIG. 2B shows an approach for clocking a target circuit with a high frequency clock while testing the target circuit with a tester having a relatively lower-speed clock, according to another example embodiment of the present invention. Using, for example, JTAG test signals with a tester such as circuit tester 340 shown in FIG. 3 for operating a target circuit such as target circuit 332 of FIG. 3, three test modes are shown including a first shift mode 250, capture mode 260 and a second shift mode 270. Signals shown in FIG. 2B include a test clock signal (TCK) 280 for operating the target circuit, a scan enable signal (SE) 282 for initiating a scan cycle, a high-frequency clock input signal (CLKI) 284 and an output clock signal (CLKO) 286. CLKI 284 may, for example, come from a source separate from the target circuit or from a PLL circuit on the target circuit, for instance, as discussed in connection with FIG. 2A. These signals are applied over time as shown (e.g., with time in the horizontal direction and voltage in the vertical direction of the signals as shown). CLKO 286 is implemented as a function of one or more of TCK 280, SE 282 and CLKI 284 and is applied for operating (clocking) the target circuit. During the shift mode 250, CLKO 286 outputs a signal corresponding to TCK 280 until the capture mode 260 is begun. In one implementation, a verification check is performed to ensure that a PLL has locked, such as discussed in connection with FIG. 2A, prior to entering the capture mode 260.

At the beginning of the capture mode 260, a short capture delay is carried out for about three clock-state transitions of CLKI 284, with CLKO 286 remaining high until the fourth clock-state change of CLKI. After the short capture delay, CLKI is applied for about two cycles (involving four clock-state change transitions), beginning with a high-to-low transition at time 287 with each two such clock-state transitions having a period (T) shown by period 290. After the clock-state change transitions of CLKI 284 have been completed, CLKO 286 remains high ("one") for the remainder of the capture mode 260.

After the capture mode 260 has been completed, SE 282 is disabled (goes high) and the second shift mode 270 is entered, wherein CLKO 286 outputs a signal corresponding to TCK 280. A delay characteristic of the output from the target circuit that is a function of the target circuit being clocked with CLKI 286 (during the clock-state transitions beginning at time 287) is detected. If the output from the target circuit shows a delay, for example as compared with a PLL approach as discussed above and in connection with FIG. 2A, a resistive and/or delay-type fault in the target circuit is detected.

Figure 3:
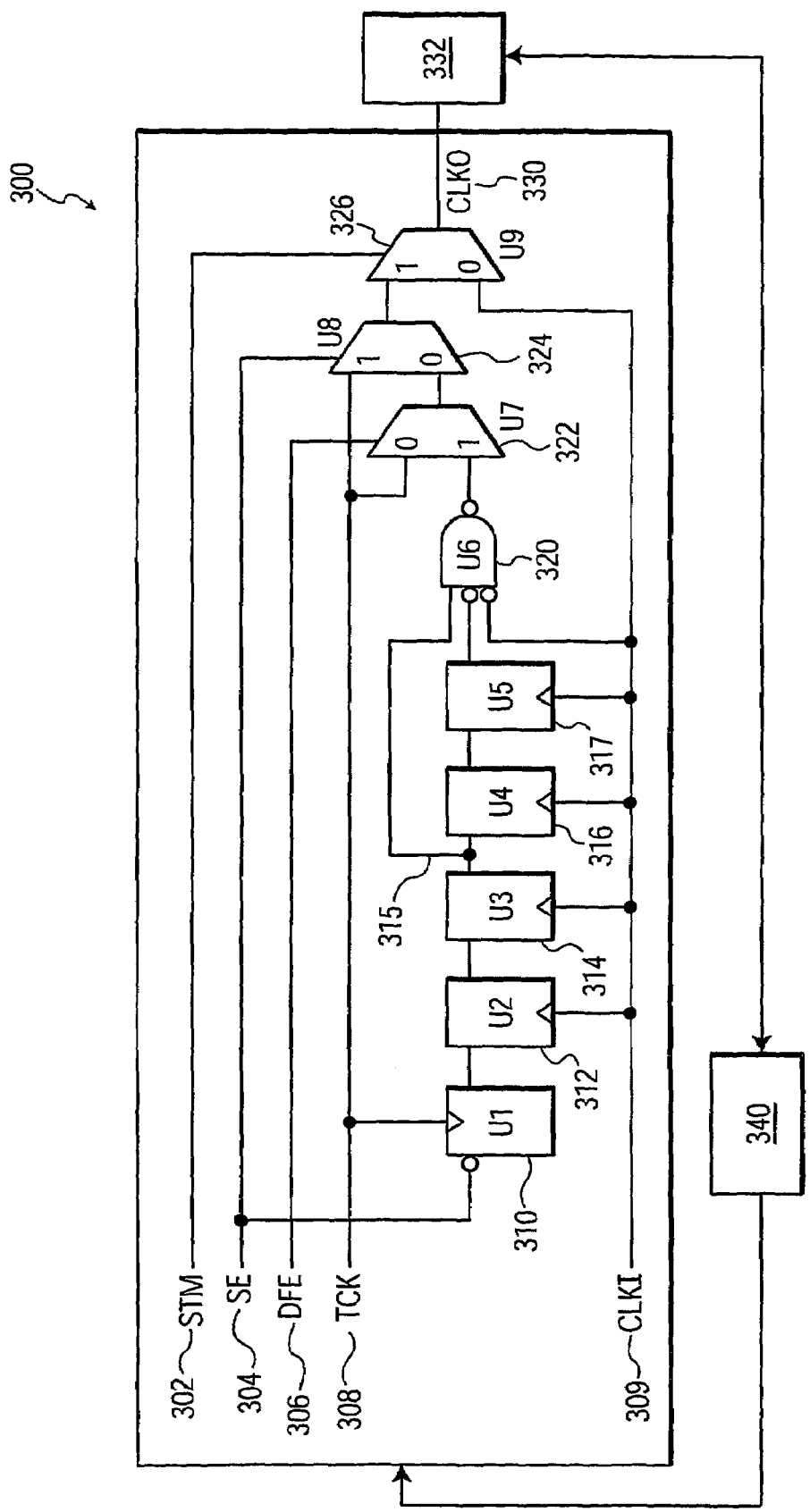
FIG. 3 shows a circuit arrangement for circuit testing involving delivering a clock signal for delay-fault testing, according to another example embodiment of the present invention.

The approaches discussed above in connection with the figures and otherwise can be implemented using a variety of circuit arrangements and approaches. FIG. 3 shows one such circuit arrangement 300, according to another example embodiment of the present invention. Table 1, as follows, discusses various signals and elements as may be implemented in connection with FIG. 3.

TABLE 1

| STM | Scan Test Mode; a control bit for this signal is located in the test control block (TCB) implemented in connection with FIG. 3. |
|---|---|
| SE | Scan Enable; controlled, for example, from an external source or circuit tester by a device pin. |
| DFE | Delay Fault Enable; a control bit for this signal is also located in the TCB. |
| TCK | Test Clock input. This input is used, for example, to shift scan chains and is controlled, for example, from an external source or circuit tester by a device pin. |
| CLKI | Clock Input; a functional clock generated, for instance, on a circuit being tested, in a tester or controlled from an external source coupled to a device pin. |
| CLKO | Clock Output; this is a clock connection to one or more circuits being tested and is responsive to the type of mode (e.g., functional or test mode) of the circuit tester. |
| U1 | Detects the start of a capture mode during a scan test (not scanned). |

TABLE 1-continued

| | scanned). |
|---|---|
| U2, U3 | Synchronizes the capture start event in the CLKI domain (not scanned). |
| U4, U5, U6 | Create two pulse, Return-To-One (RTO) clock to pass forward when SE indicates the capture mode is in progress (not scanned). |
| U7 | Selects the capture clock to be used; if DFE = 1, the two-pulse, RTO CLKI is passed forward; otherwise, TCK is used. |
| U8 | Selects whether to pass the shift clock (which is always TCK) or the capture clock (which is either TCK or a two-pulse version of CLKI). |
| U9 | Selects whether to pass the functional clock (which is always CLKI) or the DFT clock (the clock output from U8). |

The circuit 300 is shown having inputs including scan test mode (STM) 302, scan enable (SE) 304, delay fault enable (DFE) 306, test clock (TCK) 308 and a rapid clock CLKI 309. The output from the circuit 300 is CLKO 330 and is used for the operation of (clocking) a target circuit 332. A circuit tester 340, such as a JTAG tester, is used to provide the inputs STM 302, SE 304, DFE 306 and TCK 308, as well as operational inputs to the target circuit 332. An output of the target circuit 332 is also detected by the circuit tester 340 and used to detect a delay fault in the target circuit. The circuit 300 supports at least four modes of operation, for example, as discussed further below in connection with Table 2.

The circuit 300 includes five flip-flop circuits 310, 312, 314, 316 and 318, with flip-flop 310 being clocked by TCK 308 and flip-flops 312, 314, 316 and 318 being clocked by CLKI 309. Each of these flip-flop circuits are not scanned, such that during delay fault scan testing they are exercised as intended (i.e., as discussed below). The circuit 300 further includes logic circuitry, in this instance represented in the form of two-to-one multiplexers 322, 324 and 326 for selecting signals for passing forward to CLKO 330, depending upon the settings of the input signals DFE 306, SE 304 and STM 302, respectively. For example, multiplexer 322 passes TCK 308 unless the DFE 306 is "one," wherein the output from NAND gate 320 is passed forward. Multiplexer 324 passes TCK 308 forward when SE 304 is "one" and passes the output from the multiplexer 322 forward when SE is "zero" (e.g., during the capture mode as shown in FIG. 2B). Multiplexer 326 passes the output from multiplexer 324 in the scan test mode (when STM is "one") and passes CLKI 309 when not in the scan test mode (when STM is "zero"). In short, the flip-flop circuits 310-318 and the NAND gate 320 generate, in connection with SE 304, TCK 308 and CLKI 309, a two-pulse, Return-To-One output. When the STM 302 is enabled (high), SE 304 is low and DFE 306 is enabled (high), the two-pulse, Return-To-One output from the NAND gate 320 is passed forward to CLKO 330 and to the target circuit 332.

Prior to a capture mode (e.g., during a shift mode) and when SE 304 is high ("one"), for example, during a shift mode, a logical "zero" is presented to flip-flop 310 (with SE 304 inverted from "one" to "zero"). This zero is clocked through the flip-flops 310, 312, 314, 316 and 318, and presented to NAND gate 320 as a "one" (inverted) from flip-flop 318 and as a "zero" from node 315. The NAND gate 320 also receives CLKI 309, which transitions clock states between "one" and "zero." Since inputs to the NAND gate 320 are not all "one," the output presented to selector circuit 322 is a "one," for example as shown during the first portion of the capture mode 260 in FIG. 2B.

When SE 304 goes low ("zero"), for example as shown in connection with SE 282 and capture mode 260 in FIG. 2B, a logical "one" is presented to flip-flop 310 (with SE 304 inverted from "zero" to "one"). Also in response to SE 304 going low, the output from the multiplexer 322 is selected at multiplexer 324 and passed forward to multiplexer 326. When flip-flop 310 is clocked using TCK 308, the "one" is presented to flip-flop 312, which is clocked by CLKI 309. After a clock-state transition of CLKI 309, the "one" at flip-flop 312 is passed to flip-flop 314. After another clock-state transition of CLKI 309, the "one" at flip-flop 314 is passed to node 315 and flip-flop 316, with node 315, and thus the "one," being coupled to the input of NAND gate 320. At this point, a "zero" is presented by the flip-flop 318 (inverted to a "one") and the clock signal CLKI 309 is switching between high ("one") and low ("zero"). In this regard, the inverted output of NAND gate 320 is "one" when CLKI 309 is "one" and "zero" when CLKI is "zero" during the next two clock-state transitions of CLKI as a "one" is passed through flip-flops 316 and 318. Therefore, the output of the NAND gate 320 follows CLKI 309, for example, as shown for period 290 in FIG. 2B.

After these the "one" is clocked through flip-flops 316 and 318, the output from flip-flop 318 becomes "one" and the corresponding inverted signal "zero" is presented at the NAND gate 320. Correspondingly, the output from the NAND gate 320 returns to one, as shown by the portion of the CLKI 284 signal after period 290 in FIG. 2B. After SE 304 is returned to "one" (e.g., at the end of a capture mode 260 as shown in FIG. 2B), the multiplexer 324 passes TCK 308 forward.

Table 2 shows one approach for implementing the circuit 300 shown in FIG. 3, according to a more particular example embodiment of the present invention.

TABLE 2

| STM | DFE | CLKO | MODE |
| --- | --- | --- | --- |
| 0 | x | CLK1 | Functional |
| 1 | 0 | TCK | Normal Scan or Delay Fault Scan Test with external, tester clock source |
| 1 | 1 | SE = 1; TCK SE = 0; CLKI two-pulse RTO | Delay Fault scan Test using internal clock |

Referring both to FIG. 3 and Table 2, when STM 302 is not enabled (is "zero"), multiplexer 326 passes CLKI 309 (the "functional" clock in the above table) to CLKO 330. When STM 302 is "one" and DFE 306 is "zero," circuit selector 322 passes TCK 308 to multiplexer 324, which passes TCK because TCK is at both inputs "1" and "0." When STM 302, DFE 306 and SE 304 are all "one," TCK 308 is passed through to CLKO 330. When STM 302 and DFE 306 are "one" and SE 304 is "zero," the two-pulse Return-To-Zero signal from the NAND gate 320 is passed to CLKO 330.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. These approaches are implemented in connection with various example embodiments of the present invention. Such modifications and changes do not depart from the true spirit and scope of the present invention that is set forth in the following claims.

What is claimed is:

1. For use with a circuit tester having control signals used to exercise a target circuit in a test mode, the target circuit having logic circuitry that processes data in response to an operational clock signal having at least one clock cycle, a method for delay-fault testing comprising: providing a test-clock signal having at least four clock-state transitions that occur within said at least one clock cycle; concurrently using both the circuit tester to exercise the target circuit using the operational clock signal and the test-clock signal to exercise the logic circuitry and therein cause the logic circuitry to generate an output signal; and receiving and processing the output signal at the circuit tester and, therefrom, detecting a delay fault in the target circuit.

2. The method of claim 1, wherein providing a test-clock signal includes generating a rapid clock signal having said at least four clock-state transitions and wherein using the test-clock signal to exercise the logic circuitry includes selectively applying the rapid clock signal for at least four clock-state transitions.

3. The method of claim 1, further comprising: providing an interface circuit that responds to the test-clock signal and the operational clock signal to control signals by selectively passing the test-clock signal to exercise the logic circuitry.

4. The method of claim 3, wherein providing an interface circuit further comprises providing an interface circuit that has a delay mode and a capture mode and that passes the operational clock signal to the target circuit during the delay mode and passes the test-clock signal to exercise the logic circuitry during the capture mode, wherein exercising the logic circuitry and therein causing the logic circuitry to generate an output signal includes causing the logic circuitry to generate an output signal during the capture mode.

5. The method of claim 3, wherein selectively passing the test-clock signal includes selectively passing the test-clock signal during a capture mode by delaying the passing of the test-clock signal for at least one cycle of the test-clock signal after the start of the capture mode and by disabling the passing of the test-clock signal at least one cycle of the test-clock signal before the end of the capture mode.

6. The method of claim 1, wherein detecting a delay fault includes detecting a resistive circuit.

7. The method of claim 6, wherein detecting a resistive circuit includes detecting a circuit that responds slower than other circuits in the target circuit due to higher resistance in the resistive circuit.

8. The method of claim 1, wherein providing a test-clock signal includes generating the test-clock signal using circuitry in the target circuit.

9. The method of claim 1, wherein providing a test-clock signal includes using a computer programmed for selecting a frequency of the test-clock signal and selecting the frequency with the programmed computer for exercising the logic circuitry at the selected frequency.

10. The method of claim 1, prior to providing the test-clock signal, further comprising locking the phase of the receiving and processing of the output signal so that a change in phase of the output signal is detectable as a delay in the output signal from the logic circuitry.

11. For use with a circuit tester having control signals used to exercise a target circuit in a test mode, the target circuit having logic circuitry that processes data in response to an operational clock signal having at least one clock cycle, a system for delay-fault testing comprising: means for providing a test-clock signal having at least four clock-state transitions that occur within said at least one clock cycle; means for concurrently using both the circuit tester to exercise the target circuit using the operational clock signal and the test-clock signal to exercise the logic circuitry and therein cause the logic circuitry to generate an output signal; and means for receiving and processing the output signal at the circuit tester and, therefrom, detecting a delay fault in the target circuit.

12. For use with a circuit tester having control signals used to exercise a target circuit in a test mode, the target circuit having logic circuitry that processes data in response to an operational clock signal having at least one clock cycle, a system for delay-fault testing comprising: a test-clock signal generator having at least four clock-state transitions that occur within said at least one clock cycle; an interface circuit adapted to concurrently use both the circuit tester to exercise the target circuit using the operational clock signal and the test-clock signal to exercise the logic circuitry and therein cause the logic circuitry to generate an output signal; and a detection arrangement adapted to receive and process the output signal at the circuit tester and, therefrom, detect a delay fault in the target circuit.

13. The system of claim 12, wherein the test-clock signal generator is located in the target circuit and is coupled to the logic circuitry for providing the test-clock signal thereto.

14. The system of claim 12, wherein the test-clock signal generator is programmable for generating a test-clock signal having a selectable frequency.

15. The system of claim 12, further comprising the circuit tester, wherein the circuit tester is adapted to provide a scan enable signal during a capture mode, the interface circuit being further adapted to respond to the scan enable signal by entering exercising the logic circuitry is during the capture mode.

16. The system of claim 15, wherein the circuit tester is further adapted to provide a delay fault enable signal, wherein the interface circuit is adapted to respond to the delay fault enable signal and the scan enable signal by delaying the application of the test-clock signal for exercising the logic circuitry for at least one clock-state transition of the test-clock signal after the scan enable signal has been enabled and to disable the application of the test-clock signal for exercising the logic circuitry at least one clock-state transition of the test-clock signal before the scan enable signal has been disabled.

17. The system of claim 15, wherein the circuit tester is adapted to provide the control signals to the logic circuitry using the test-clock signal.

18. The system of claim 12, wherein the test-clock signal generator includes a latching circuit configured and arranged for locking the phase of the output signal to a reference for detecting a delay as a change in the phase of the output signal.

19. The system of claim 18, wherein the latching circuit is adapted to lock the phase of the output signal after a test vector has been initiated to the target circuit and prior to the interface circuit concurrently using both the circuit tester to exercise the target circuit using the operational clock signal and the test-clock signal to exercise the logic circuitry and therein cause the logic circuitry to generate an output signal.

20. For use with a delay-fault circuit tester adapted to provide test signals to a target circuit using an operational clock having at least one clock cycle, a circuit chip comprising: a target circuit including logic circuitry susceptible to timing-related failures at high operational clock speeds and being operational in a test mode in response to test signals from the circuit tester; a test-clock signal generator circuit programmed to selectively provide a high-speed test-clock clock signal having at least four clock-state transitions that occur within said at least one clock cycle of the operational clock; and a clock interface circuit adapted to selectively separately apply one of the operational clock signal and the test-clock signal to the target circuit to exercise the target circuit, the test-clock signal being selectively applied during a capture mode to cause the target circuit to generate an output signal that is detectable by the circuit tester for detecting a delay in the output signal that is a function of a timing-related failure in the target circuit that occurs in response to the target circuit being exercised by the high-speed test-clock signal.

\* \* \* \* \*